United States Patent

Nomura et al.

[11] Patent Number: 5,892,999
[45] Date of Patent: Apr. 6, 1999

[54] ZOOM LENS BARREL WITH SHUTTER MOUNTING UNIT

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 777,482

[22] Filed: Dec. 30, 1996

[30] Foreign Application Priority Data

Jan. 26, 1996 [JP] Japan .................................. 8-12317
Jan. 29, 1996 [JP] Japan .................................. 8-13387

[51] Int. Cl.⁶ ....................................................... G03B 9/08
[52] U.S. Cl. ............................................ 396/462; 359/819
[58] Field of Search ................................. 396/25, 72, 79, 396/83, 85, 86, 87, 451, 462, 529; 359/513, 676, 819, 823–826

[56] References Cited

U.S. PATENT DOCUMENTS

| | | |
|---|---|---|
| 4,309,077 | 1/1982 | Tomori . |
| 4,865,432 | 9/1989 | Aoyagi et al. . |
| 4,910,544 | 3/1990 | Nomura .................................. 396/79 |
| 5,157,429 | 10/1992 | Haraguchi et al. . |
| 5,231,449 | 7/1993 | Nomura . |
| 5,245,476 | 9/1993 | Shono . |
| 5,305,145 | 4/1994 | Tanaka .................................. 396/25 X |
| 5,453,807 | 9/1995 | Iizuka . |
| 5,488,513 | 1/1996 | Tanaka . |
| 5,510,936 | 4/1996 | Aoki et al. . |
| 5,774,748 | 6/1998 | Ito et al. .................................. 396/87 X |

FOREIGN PATENT DOCUMENTS

| | | |
|---|---|---|
| 0854056 | 11/1960 | United Kingdom . |
| 1238668 | 7/1971 | United Kingdom . |

OTHER PUBLICATIONS

A United Kingdom Search Report, dated Apr. 16, 1997, with UK Application No. 9701434.4.

*Primary Examiner*—Howard B. Blankenship
*Attorney, Agent, or Firm*—Greenblum & Bernstein, P.L.C.

[57] ABSTRACT

A lens supporting mechanism for a lens shutter camera includes a front lens group, a lens supporting barrel, a movable barrel, a rear lens group, and a shutter mounting barrel which includes a shutter with an AE function. The front lens group is fixed to the lens supporting barrel. Both the lens supporting barrel and the shutter mounting barrel are fixed to the movable barrel. The rear lens group is attached to either the movable barrel or the shutter mounting barrel such that the rear lens group is movable along the optical axis relative to the moveable barrel. During operation of the zoom lens, the movable barrel advances and retreats along the optical axis.

23 Claims, 15 Drawing Sheets

ZOOM LENS BARREL WITH SHUTTER MOUNTING UNIT

BACKGROUND OF THE INVENTION

1. Field of the Invention

The present invention relates to a lens supporting mechanism for a camera. In particular, the present invention relates to the mechanism to fix a lens supporting barrel supporting a lens group to a movable barrel that is driven in a direction of an optical axis.

2. Background and Material Information

A lens shutter camera may be provided with a shutter unit that is arranged between or behind lens groups of a photographing lens. Since the lens group comprises a plurality of lenses, generally they are installed in a lens supporting barrel. In the case where at least one of the lens groups are driven along an optical axis together with the shutter unit, i.e., the photographing lens is a zoom lens or the photographing lens can be switched between a retracted position and a photographing position, the lens group and the shutter unit are arranged on a movable barrel.

In the conventional lens shutter camera, the lens supporting barrel for a front movable lens group is fixed to the shutter unit at the rear side of the lens supporting barrel, and the shutter unit is fixed to the movable barrel at the rear side thereof. Alternatively, the lens supporting barrel is fixed to the movable barrel at the front side thereof and the shutter unit is fixed to the movable barrel at the front side thereof.

According to the conventional structures, an accurate alignment of the lens supporting barrel with the movable barrel is difficult because of a cantilever support for the lens supporting barrel. That is, when the lens supporting barrel is fixed to the shutter unit, the lens supporting barrel is only supported at the rear side. On the other hand, when the lens supporting barrel is fixed to the movable barrel at the front side, the lens supporting barrel is only supported at the front side. In either case, the positional relationships may be changed.

Furthermore, when a camera is provided with a zoom lens having front and rear lens groups, it is necessary to make optical axes of the lens groups coaxial. However, the front lens group and the rear lens group, which are driven along an optical axis respectively during zooming operation, are guided by the different guide mechanisms in a conventional camera, and it is difficult to keep the coaxial condition during zooming operation.

SUMMARY OF THE INVENTION

It is therefore an object of the present invention to provide an improved lens supporting mechanism for a camera which provides for accurate alignment of the lens supporting barrel with the movable barrel.

Another object of the present invention is to provide an improved lens supporting mechanism for a camera having a zoom lens which maintains the coaxial condition of the optical axes of front and rear lens groups of the zoom lens.

In an aspect of a lens supporting mechanism according to the invention, the lens supporting mechanism includes a movable barrel that is driven along an optical axis direction, and a lens supporting barrel for supporting a lens group. The lens supporting barrel is fixed to the movable barrel at both front and rear sides along the optical axis.

Since the lens supporting barrel is fixed to the movable barrel at both front and rear sides, the relationship among the movable barrel and the lens supporting barrel can be accurately set.

In a particular case, a photographing lens may comprise a zoom lens having front and rear lens groups. In this case, the lens supporting barrel for the front lens group is fixed to the movable barrel at the front end thereof and the lens supporting barrel is fixed to the shutter unit at the rear end thereof.

In another aspect of the invention, the lens supporting mechanism may include a movable barrel that is driven along an optical axis direction, a shutter unit that is attached to the movable barrel, a front lens supporting barrel for supporting a front lens group arranged at an object side of the shutter unit, the front lens supporting barrel being fixed to the shutter unit at the rear end thereof, and a rear lens supporting barrel for supporting a rear lens group arranged at an image side of the shutter unit. The rear lens supporting barrel being movably supported by the shutter unit.

Since the front and rear lens groups are supported by the same base, i.e., the shutter unit positioned between the lens groups, it is easier to maintain the coaxial condition of the lens groups than the conventional mechanism where the lens groups are guided by the different guide mechanisms.

DETAILED DESCRIPTION OF THE PREFERRED EMBODIMENTS

Preferred embodiments of an encoder for detecting forward/reverse rotation of a rear lens group driving motor are described as applied to a lens-shutter type zoom lens camera.

Figure 11:
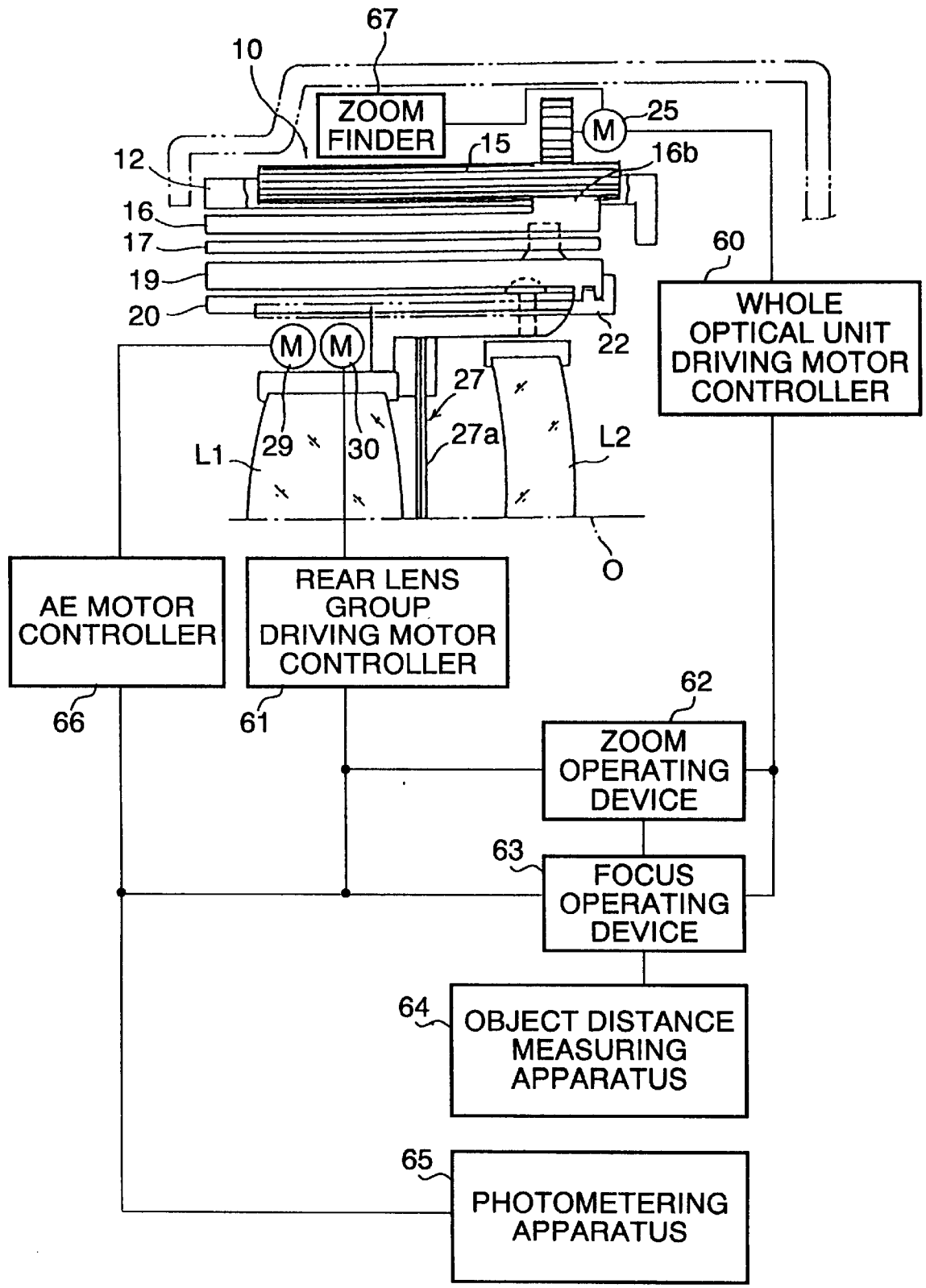
FIG. 11 is a block diagram of a controlling system for controlling an operation of the zoom lens barrel.

The concept of the zoom lens camera will now be described with reference to FIG. 11. FIG. 11 is a schematic representation of various elements which comprise a zoom lens camera.

The zoom lens camera is provided with a three-stage delivery-type zoom lens barrel 10 having three movable barrels, namely a first movable barrel 20, a second movable barrel 19 and a third movable barrel 16, which are concentrically arranged in this order from an optical axis O. In the zoom lens barrel 10, two lens groups are provided, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operative device 62 may comprise as, for example, a manually-operable zoom operating lever (not shown) provided on the camera body or a pair of zoom buttons, e.g., a "wide" zoom button and a "tele" zoom button, (not shown) provided on the camera body. When the zoom operating device 62 is operated, the whole optical unit driving motor controller 60 drives a whole optical unit driving motor 25 to move the front lens group L1 and the rear lens group L2, rearwardly or forwardly. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies sequentially to the variation of the focal length through the operation of the zoom operating device 62. Therefore, the photographer may perceive the variation of the set focal length through the operation of the zoom operating device 62, by observing the variation of image magnification of the visual field of the finder. In addition, the focal length, set by the operation of the zoom operating device 62, may be indicated as a value on an LCD (liquid crystal display) panel (not shown) or the like.

When the focus operating device 63 is operated, the whole optical unit driving motor controller 60 drives the whole optical unit driving motor 25. At the same time the rear lens group driving motor controller 61 drives a rear lens group driving motor 30. The driving of the whole optical unit driving motor controller 60 and the rear lens group driving motor controller 61, moves the front and rear lens groups L1 and L2 to respective positions corresponding to a set focal length and a detected object distance, such that the zoom lens is focused on the object.

Specifically, the focus operating device 63 is provided with a release button (not shown) provided on an upper wall of the camera body. A photometering switch and a release switch (both not shown) are synchronized with the release button. When the release button is half-depressed (half-step), the photometering switch is turned ON, and the object distance measuring and photometering commands are respectively input to the object distance measuring apparatus 64 and the photometering apparatus 65.

When the release button is fully depressed (full step), the release switch is turned ON, and according to the result of object distance measuring command and a set focal length, the whole optical unit driving motor 25 and the rear lens group driving motor 30 are driven. In addition, the focusing operation, in which the front lens group L1 and the rear lens group L2 move to the focusing position, is executed. Further, an AE motor 29 of an AF/AE (i.e., autofocus/autoexposure) shutter unit (FIG. 9) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operating device 62 is operated, the zoom operating device 62 drives the whole optical unit driving motor 25 to move the front and rear lens groups L1 and L2 together as a whole along the optical axis O (optical axis direction). Simultaneous with such a movement, the rear lens group driving motor 30 may also be driven via the rear lens group driving motor controller 61 to move the rear lens group L2 relatively with respect to the first lens group L1. However, this above-described operation is not performed under the conventional concept of zooming, in which the focal length is varied sequentially while maintaining an in-focus condition. When the zoom operating device 62 is operated, the front lens group L1 and the rear lens group L2 move in the optical axis direction, without varying the distance therebetween, by driving only the whole optical unit driving motor 25.

During the zooming operation, an in-focus condition cannot be maintained at all times with respect to an object located at a specific distance. However, this is not a problem in a lens-shutter type camera, since the image of the object is not observed through the photographing optical system, but rather through the finder optical system, that is provided separate from the photographing optical system. Thus, it is sufficient that the in-focus condition is obtained when the shutter is released. Accordingly, when the release button is fully depressed, the focusing operation (focus adjusting operation) is carried out by moving at least one of the whole optical unit driving motor 25 and the rear lens group driving motor 30. In such a manner, when the focus operating device 63 is operated and since each of the two lens groups L1, L2 can be driven independently, the position of the lens groups L1, L2 can be flexibly controlled.

An embodiment of the zoom lens barrel according to the above concept will be described with reference to mainly FIGS. 9 and 10.

The overall structure of the zoom lens barrel 10 will now be described.

The zoom lens barrel 10 is provided with the first movable barrel 20, the second movable barrel 19, the third movable barrel 16, and a fixed lens barrel block 12. The third movable barrel 16 engages a cylindrical portion 12p of the fixed lens barrel block 12, and moves along the optical axis O upon being rotated. A linear guide barrel 17 is provided on an inner periphery of the third movable barrel 16 which is rotationally restricted. The linear guide barrel 17 and the third movable barrel 16 move together as a whole along the optical axis O, with the third movable barrel 16 rotating relative to the linear guide barrel 17. The first movable barrel 20 moves along the optical axis O and is rotationally restricted. The second movable barrel 19 rotatably moves relative to the linear guide barrel 17 and the first movable barrel 20 along the optical axis O. The whole optical unit driving motor 25 is secured to the fixed lens barrel block 12. A shutter mounting stage 40 is secured to the first movable barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

The fixed lens barrel block 12 is fixed in front of an aperture plate 14 fixed to the camera body. The aperture plate 14 is provided on a center thereof with a rectangular-shaped aperture 14a which forms the limits of each exposed frame. The fixed lens barrel block 12 is provided, on an inner periphery of the cylindrical portion 12p thereof, with a female helicoid 12a, and also a plurality of linear guide grooves 12b each extending parallel to the optical axis O, i.e., extending in the optical axis direction. At the bottom of one of the linear guide grooves 12b, namely 12b', a code plate 13a, having a predetermined code pattern, is fixed. The code plate 13a extends in the optical axis direction and extends substantially along the whole of the length of the fixed lens barrel block 12. The code plate 13a is part of a flexible printed circuit board 13 positioned outside the fixed lens barrel block 12.

Figure 7:
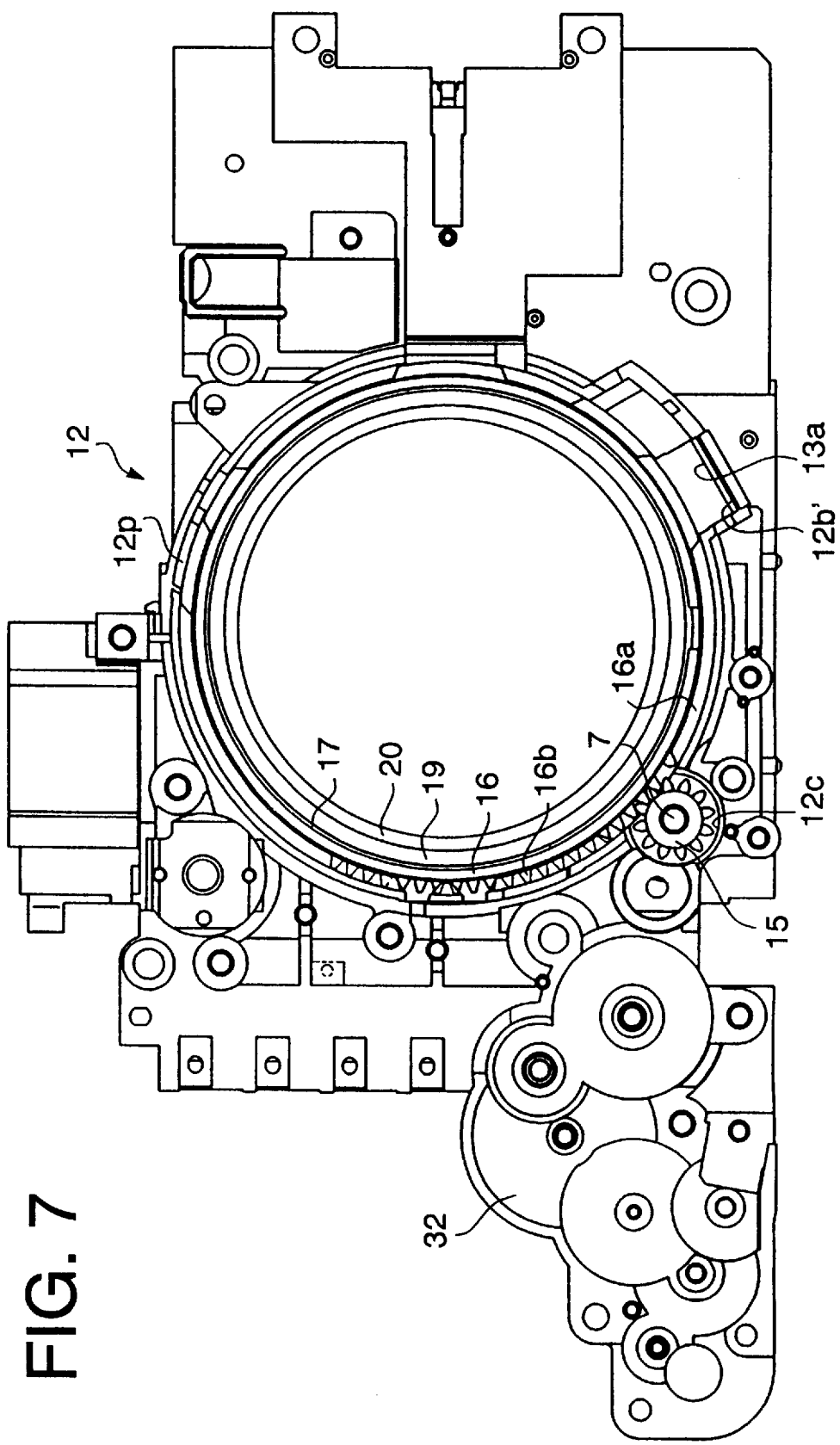
FIG. 7 is a front elevational view of a fixed lens barrel block of the zoom lens barrel.
Figure 10:
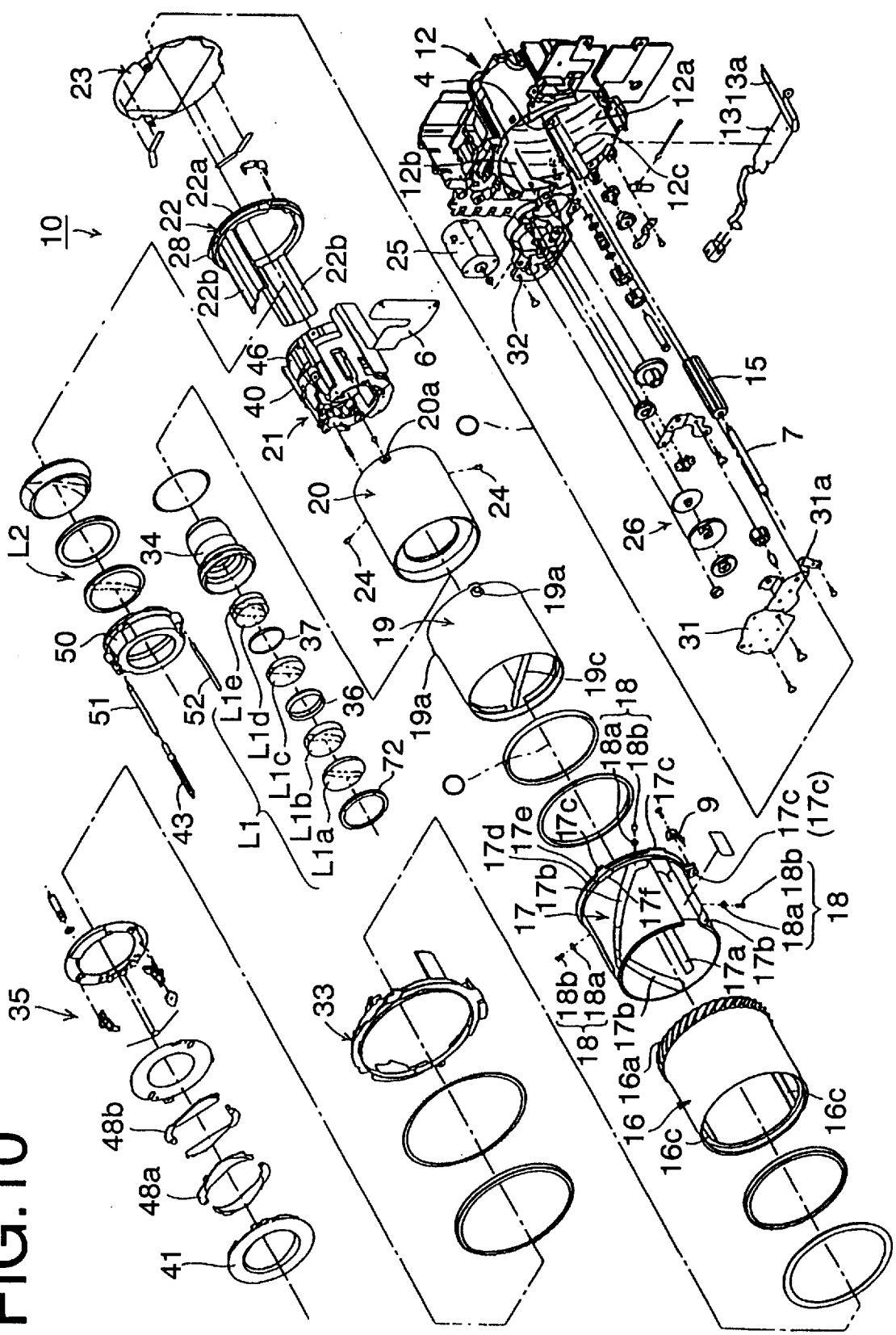
FIG. 10 is an exploded perspective view of the overall structure of the zoom lens barrel.

A gear housing 12c is provided as shown in FIG. 7 or 10 in the fixed lens barrel block 12. The gear housing 12c is recessed outwardly from an inner periphery of the cylindrical portion 12p of the fixed lens barrel block 12 in a radial direction while extending in the optical axis direction,. In the gear housing 12c, a driving pinion 15, extending in the optical axis direction, is rotatably positioned. Both ends of an axial shaft 7 of the driving pinion 15 are rotatably supported by a supporting hollow 4, which is provided in the fixed lens barrel block 12, and a supporting hollow 31a, which is provided on a gear supporting plate 31 fixed on the fixed lens barrel block 12 by set screws (not shown), respectively. Part of the teeth of the driving pinion 15 project inwardly from the inner periphery of the cylindrical portion of the fixed lens barrel block 12, so that the driving pinion 15 meshes with an outer peripheral gear 16b of the third movable barrel 16, as shown in FIG. 7.

Figure 6:
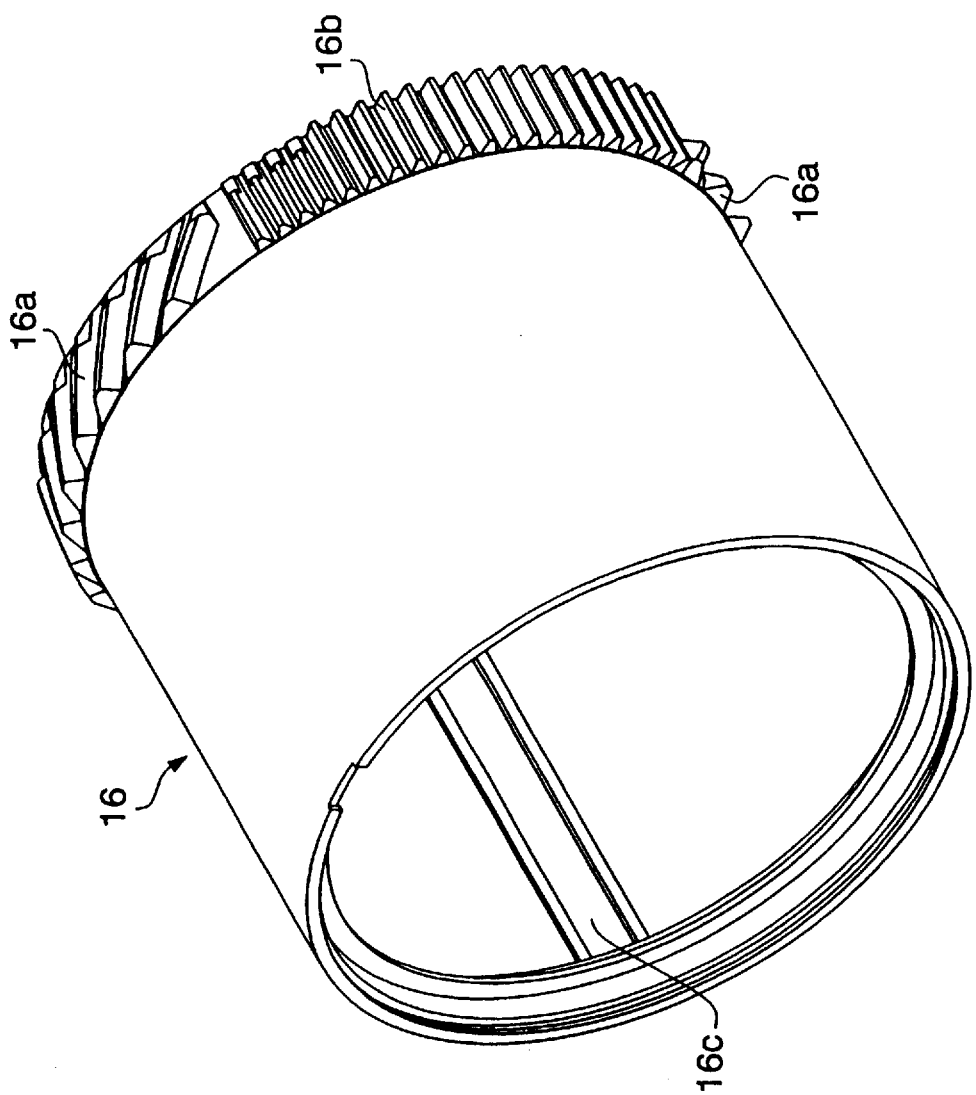
FIG. 6 is an external schematic perspective view of a third movable barrel of the zoom lens barrel.

A plurality of linear guide grooves 16c are formed on an inner periphery of the third movable barrel 16, each of which extends parallel to the optical axis O. At an outer periphery of the rear end of the third movable barrel 16, a male helicoid 16a and the aforementioned outer peripheral gear 16b are provided as shown in FIG. 6. The male helicoid 16a engages with the female helicoid 12a of the fixed lens barrel block 12. The outer peripheral gear 16b engages with the driving pinion 15. The driving pinion 15 has an axial length sufficient to engage with the outer peripheral gear 16b throughout the entire range of movement of the third movable barrel 16 in the optical axis direction.

As shown in FIG. 10, the linear guide barrel 17 is provided with a rear end flange 17d on a rear part of an outer periphery. The rear end flange 17d has a plurality of engaging projections 17c each projecting away from the optical axis O in a radial direction. The linear guide barrel 17 is further provided with an anti-dropping flange 17e in front of the rear end flange 17d. A circumferential groove 17g is formed between the rear end flange 17d and the anti-dropping flange 17e. The anti-dropping flange 17e has a radius which is smaller than the rear end flange 17d. The anti-dropping flange 17e is provided with a plurality of cutout portions 17f. Each of the cutout portions 17f allows a corresponding engaging projection 16d to be inserted into the circumferential groove 17g, as shown in FIG. 9.

The third movable barrel 16 is provided with a plurality of engaging projections 16d on an inner periphery of the rear end thereof. Each of the engaging projections 16d projects towards the optical axis O in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 9). By rotating the third movable barrel 16 relative to the linear guide barrel 17, the engaging projections 16d are engaged with the linear guide barrel 17.

An aperture plate 23 having a rectangular-shaped aperture 23a approximately the same shape as the aperture 14a is fixed on the rear end of the linear guide barrel 17. The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O.

A contacting terminal 9 is fixed to one of the engaging projections 17c, in particular projection 17c'. The contacting terminal 9 is in slidable contact with the code plate 13a, fixed to the bottom of the linear guide groove 12b', to generate signals corresponding to focal length information during zooming.

On the inner periphery of the linear guide barrel 17 a plurality of linear guide grooves 17a are formed, each extending parallel to the optical axis O. A plurality of lead slots 17b are also formed on the linear guide barrel 17 as shown in FIG. 10. The lead slots 17b are each formed oblique (inclined) to the optical axis O.

The second movable barrel 19 engages with the inner periphery of the linear guide barrel 17. A plurality of lead grooves 19c are provided on the inner periphery of the second movable barrel 19, in a direction inclined oppositely to the lead slots 17b. A plurality of follower projections 19a are provided On the outer periphery of the rear end of the second movable barrel 19. Each of the follower projections 19a has a trapezoidal cross-sectional shape projecting away from the optical axis O in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third movable barrel 16. With such an arrangement, when the third movable barrel 16 rotates, the second movable barrel 19 rotates while moving linearly in the optical axis direction.

The first movable barrel 20 is engaged to the inner periphery of the second movable barrel 19. A plurality of follower pins 24 are provided on an outer periphery of the rear of the first movable barrel 20, each engaging with the corresponding inner lead groove 19c. In addition, the first movable barrel 20 is guided linearly by a linear guide member 22. The first movable barrel 20 is provided at the front end thereof with a decorative plate 41.

Figure 1:
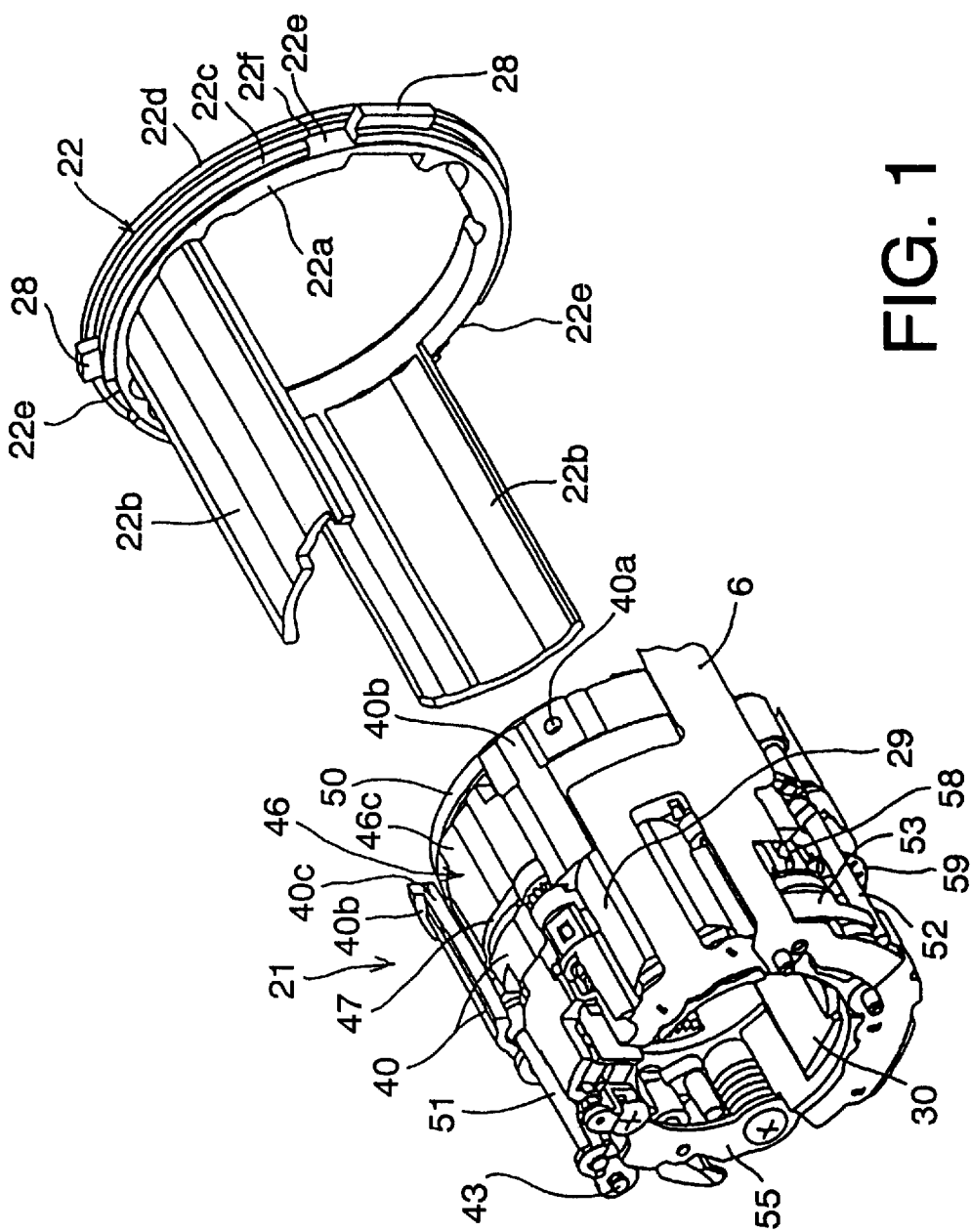
FIG. 1 is an enlarged schematic perspective view showing a part of a zoom lens barrel.
Figure 2:
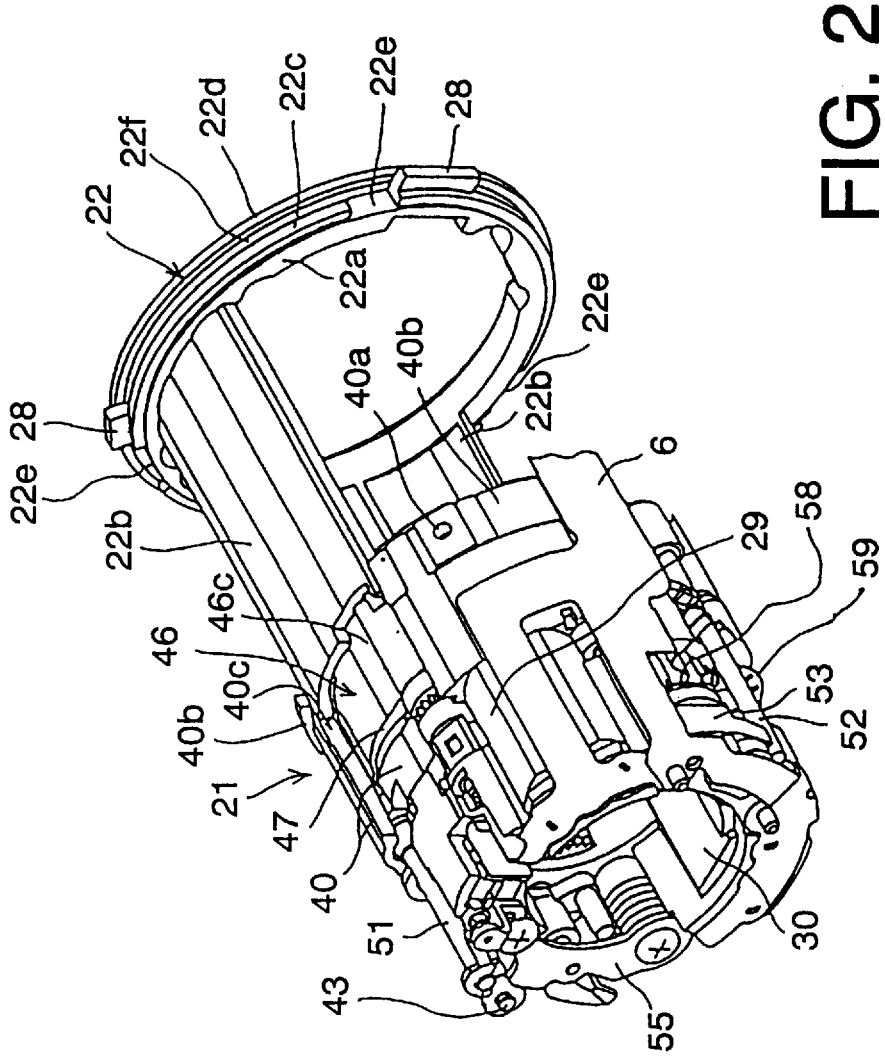
FIG. 2 is a schematic perspective view showing the part of the zoom lens barrel shown in FIG. 1 in an engaged state.
Figure 3:
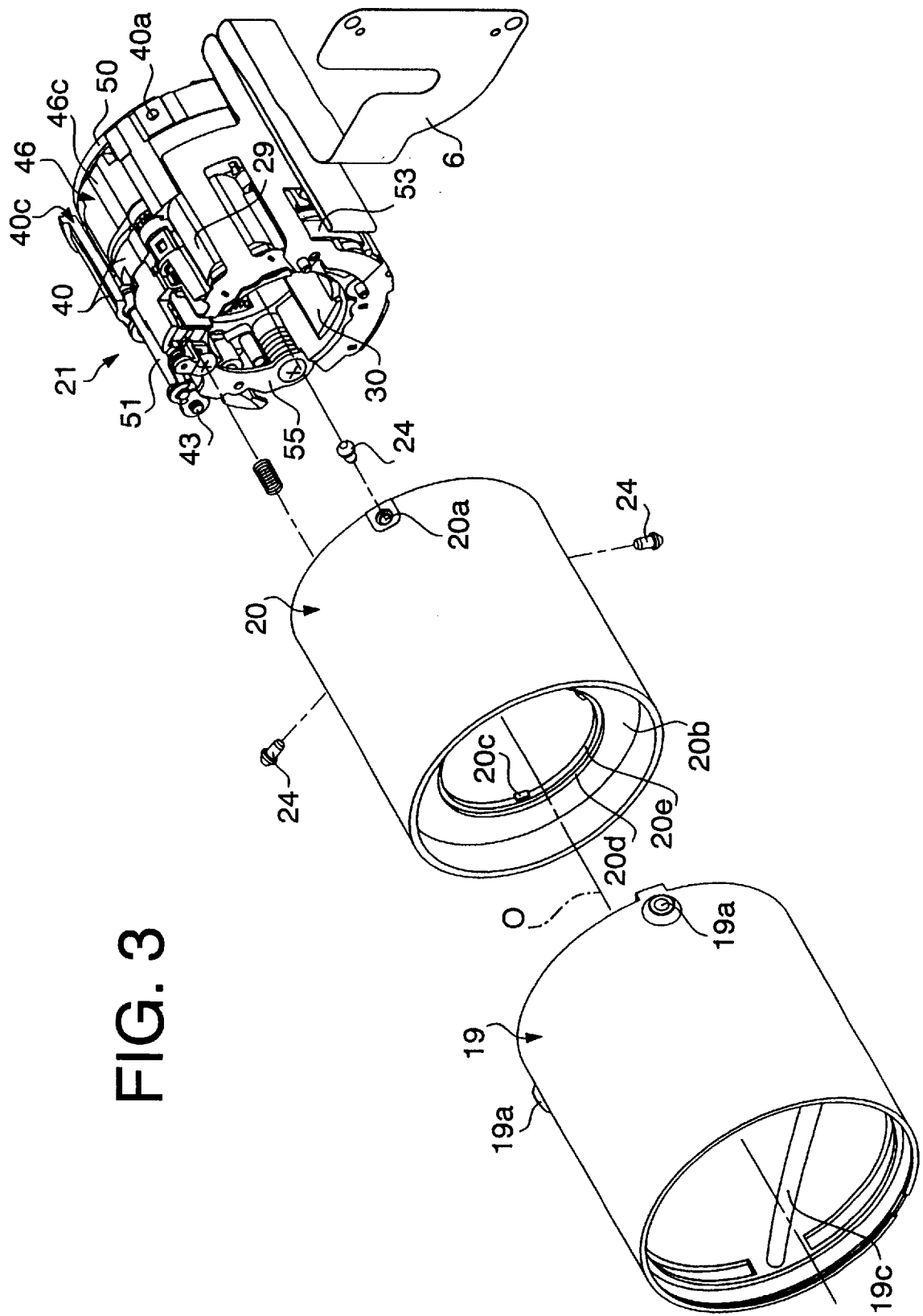
FIG. 3 is an enlarged exploded perspective view showing a part of the zoom lens barrel.

As shown in FIGS. 1 and 2, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis O in a radial direction. The engaging projections 28 slidably engage with the linear guide grooves 17a. The guide legs 22b are respectively inserted into linear guides 40c between the inner peripheral surface of the first movable barrel 20 and the AF/AE shutter unit 21.

The annular member 22a of the linear guide member 22 is connected to the rear of the second movable barrel 19, such that the linear guide member 22 and the second movable barrel 19 move along the optical axis O as a whole, and in addition are capable of relatively rotating with respect to each other around the optical axis O. The linear guide member 22 is further provided, on the outer periphery of the rear end thereof, with a rear end flange 22d. The linear guide member 22 is also provided with an anti-dropping flange 22c in front of the rear end flange 22d. A circumferential groove 22f is formed between the rear end flange 22d and the anti-dropping flange 22c. The anti-dropping flange 22c has a radius which is smaller than the rear end flange 22d. As shown in FIG. 1 or 2, the anti-dropping flange 22c is provided with a plurality of cutout portions 22e, each allowing a corresponding engaging projection 19b to be inserted into the circumferential groove 22f (see FIG. 9).

A plurality of engaging projections 19b, each projecting towards the optical axis O in a radial direction are provided on an inner periphery of the rear end of the second movable barrel 19. By inserting the engaging projections 19b into the circumferential groove 22f through the corresponding cutout portions 22e, the engaging projections 19b are positioned in the circumferential groove 22f between the flanges 22c and 22d. By rotating the second movable barrel 19 relative to the linear guide member 22, the engaging projections 19b are engaged with the linear guide member 22. With the above structure, when the second movable barrel 19 rotates in the forward or reverse rotational direction, the first movable barrel 20 moves linearly, forwardly or rearwardly along the optical axis O, but is restricted from rotating.

Figure 8:
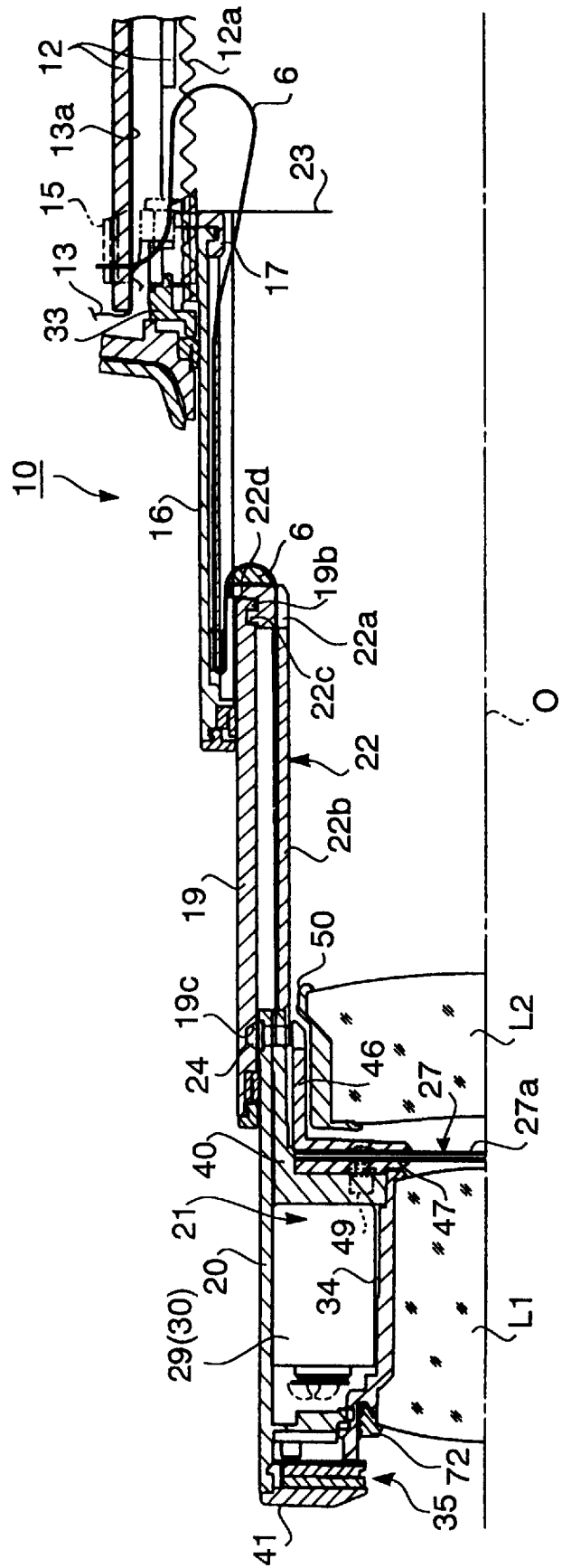
FIG. 8 is a sectional view of an upper part of the zoom lens barrel in a maximum extended state.

A barrier apparatus 35 having barrier blades 48a and 48b is mounted to the front of the first movable barrel 20. On an inner peripheral face of the first movable barrel 20 the AF/AE shutter unit 21 is engaged and fixed, as shown in FIG. 8. The AF/AE shutter unit 21 includes the shutter 27, which consists of three shutter blades 27a The AF/AE shutter unit 21 is provided with a plurality of fixing holes 40a formed at even angular intervals on the outer periphery of the shutter mounting state 40. Only one of the fixing holes 40a appears in each of FIGS. 1–5.

Figure 4:
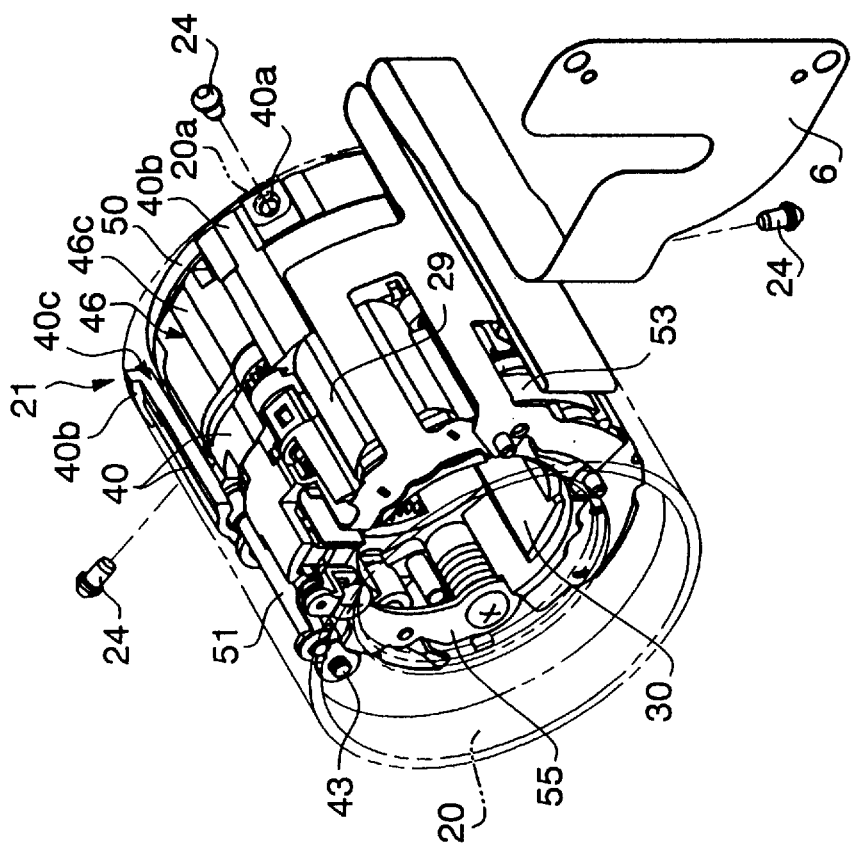
FIG. 4 is a schematic perspective view illustrating a state where an AF/AE shutter unit of the zoom lens barrel is mounted to a first movable barrel.

The aforementioned plurality of follower pins 24, which engage with the inner lead grooves 19c, also serve as device for fixing the AF/AE shutter unit 21 to the first movable barrel 20. The follower pins 24 are inserted and fixed in holes 20a, formed on the first movable barrel 20, and in the fixing holes 40a. With this arrangement the AF/AE shutter unit 21 is secured to the first movable barrel 20 as shown in FIG. 4. In FIG. 4 the first movable barrel 20 is indicated by phantom lines. The follower pins 24 may be fixed by an adhesive, or the pins 24 may comprise as screws which are screwed into the fixing holes 40a.

Figure 5:
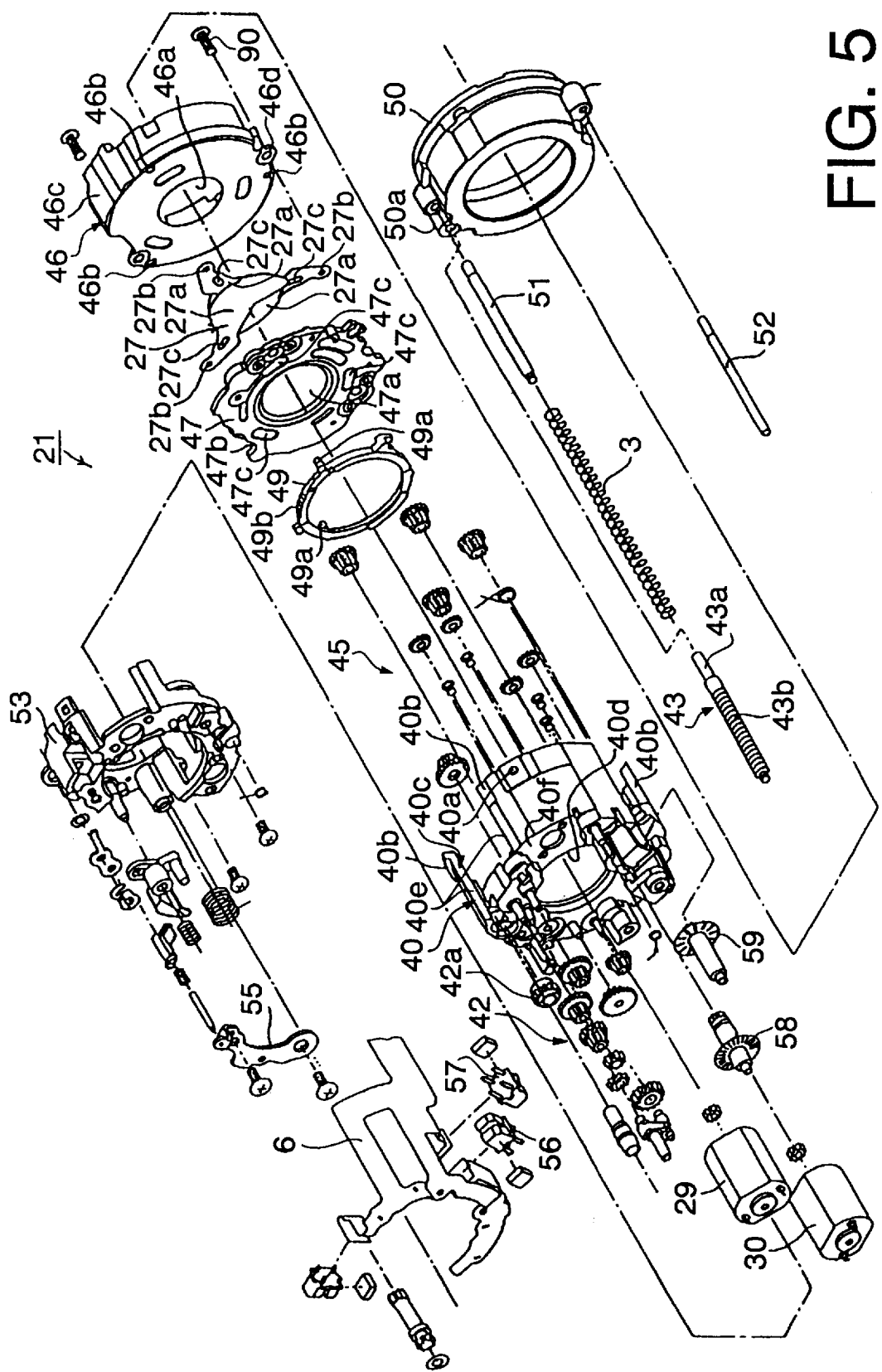
FIG. 5 is an exploded perspective view illustrating main parts of the AF/AE shutter unit of the zoom lens barrel.

As illustrated in FIGS. 5 and 10, the AF/AE shutter unit 21 is provided with the shutter mounting state 40, a shutter blade supporting ring 46 which is fixed on the rear of the shutter mounting stage 40 so as to be located inside the shutter mounting stage 40, and the lens supporting barrel 50 supported such that it is movable relative to the shutter mounting stage 40. The lens supporting barrel 34, the AE motor 29, and the rear lens group driving motor 30, are supported on the shutter mounting stage 40. The shutter mounting stage 40 is provided with an annular member 40f having a circular aperture 40d. The shutter mounting stage 40 is also provided with three legs 40b which project rearwardly with respect to the camera body from the annular member 40f. Three slits are defined between the three legs 40b. Two of the slits comprise the aforementioned linear guides 40c, which slidably engage with the respective pair of guide legs 22b of the linear guide member 22, so as to guide the movement of the linear guide member 22.

The shutter mounting stage 40 supports an AE gear train 45 which transmits a rotation of the AE motor 29 to the shutter 27, a lens driving gear train 42 which transmits rotation of the rear lens group driving motor 30 to a screw shaft 43, photo-interrupters 56, 57a and 57b which are connected to a flexible printed circuit board 6, and rotating disks 58, 59a and 59b, having a plurality of radially formed slits provided in the circumferential direction. An encoder for detecting whether the rear lens group driving motor 30 is rotating and for detecting an amount of rotation of the rear lens group driving motor 30 consists of the photo-interrupters 57a, 57b and the rotating disks 59a, 59b. An AE motor encoder for detecting whether the AE motor 29 is rotating and for detecting an amount of rotation of the AE motor 29 consists of the photo-interrupter 56 and the rotating disk 58.

The shutter 27, a supporting member 47 which pivotally supports the three shutter blades 27a of the shutter 27, and a circular driving member 49, which provides rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 5, the shutter blade supporting ring 46 is provided, at a front end thereof, with a circular aperture 46a and with three supporting holes 46b positioned at even angular intervals around the circular aperture 46a. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47, positioned in front of the shutter blade supporting ring 46, is provided with a circular aperture 47a, aligned with the circular aperture 46a of the shutter blade supporting ring 46, and with three pivotal shafts 47b (only one of which is illustrated in FIG. 10) at respective positions opposite the three supporting holes 46b. Each shutter blade 27a is provided at one end thereof with a hole 27b into which the corresponding pivotal shaft 47b is inserted, such that each shutter blade 27a is rotatable about the corresponding pivotal shaft 47b. The major part of each shutter blade 27a, that extends normal to the optical axis O from the pivoted end, is formed as a light-interceptive portion. All three light-interceptive portions of the shutter blades 27a together prevent ambient light, which enters the front lens group L1, from entering the circular apertures 46a and 47a when the shutter blades 27a are closed. Each shutter blade 27a is further provided, between the hole 27b and the light-interceptive portion thereof, with a slot 27c, through which the corresponding operating projection 49a is inserted. The supporting member 47 is fixed to the shutter blade supporting ring 46 in such a manner that, each shaft 47b, which supports the corresponding shutter blade 27a, is engaged with the corresponding supporting hole 46b of the shutter blade supporting ring 46.

A gear portion 49b is formed on a part of the outer periphery of the circular driving member 49. The gear portion 49b meshes with one of the plurality of gears in the gear train 45 to receive the rotation force from the gear train 45. The supporting member 47 is provided, at respective positions close to the three pivotal shafts 47b, with three arc grooves 47c each arched along a circumferential direction. The three operating projections 49a of the circular driving ring 49 engage with the slots 27c of the respective shutter blades 27a through the respective arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by set screws 90 respectively inserted through holes 46d provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42a, provided as one of the gears in the gear train 42, is provided with a female thread hole (not shown) at the axial center thereof, and is restricted to move in the axial direction. The screw shaft 43, one end of which is fixed to the lens supporting barrel 50, engages with the female thread hole of the driving gear 42a. Accordingly, the driving gear 42a and the screw shaft 43 together constitute a feed screw mechanism. In such a manner, when the driving gear 42a rotates forwardly or reversely due to driving by the rear lens group driving motor 30, the screw shaft 43 moves forwardly or rearwardly with respect to the driving gear 42a, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws (not shown). The motors 29, 30 and the photo-interrupters 56, 57a and 57b are connected to the flexible printed circuit board 6. One end of the flexible printed circuit board 6 is fixed to the shutter mounting stage 40.

After the first, second and third movable barrels 20, 19 and 16, and the AF/AE shutter unit 21, etc. are assembled, the aperture plate 23 is fixed to the rear of the linear guide barrel 17, and a supporting member 33 having a circular shape is fixed at the front of the fixed lens barrel block 12.

In the above-described embodiment of the zoom lens barrel 10, although the zoom lens optical system consists of two movable lens groups, namely the front lens group L1 and the rear lens group L2, it should be understood that the present invention is not limited to the present embodiment disclosed above, but the present invention may also be applied to another type of zoom lens optical system including one or more fixed lens groups.

In addition, in the above embodiment, the rear lens group L2 is supported on the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be constructed in such a manner that the rear lens group L2 is not supported by the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by any supporting member other than the AF/AE shutter unit 21.

The operation of the zoom lens barrel 10, by rotation of the whole optical unit driving motor 25 and the rear lens group driving motor 30, will now be described with reference to FIGS. 8 and 9.

Figure 9:
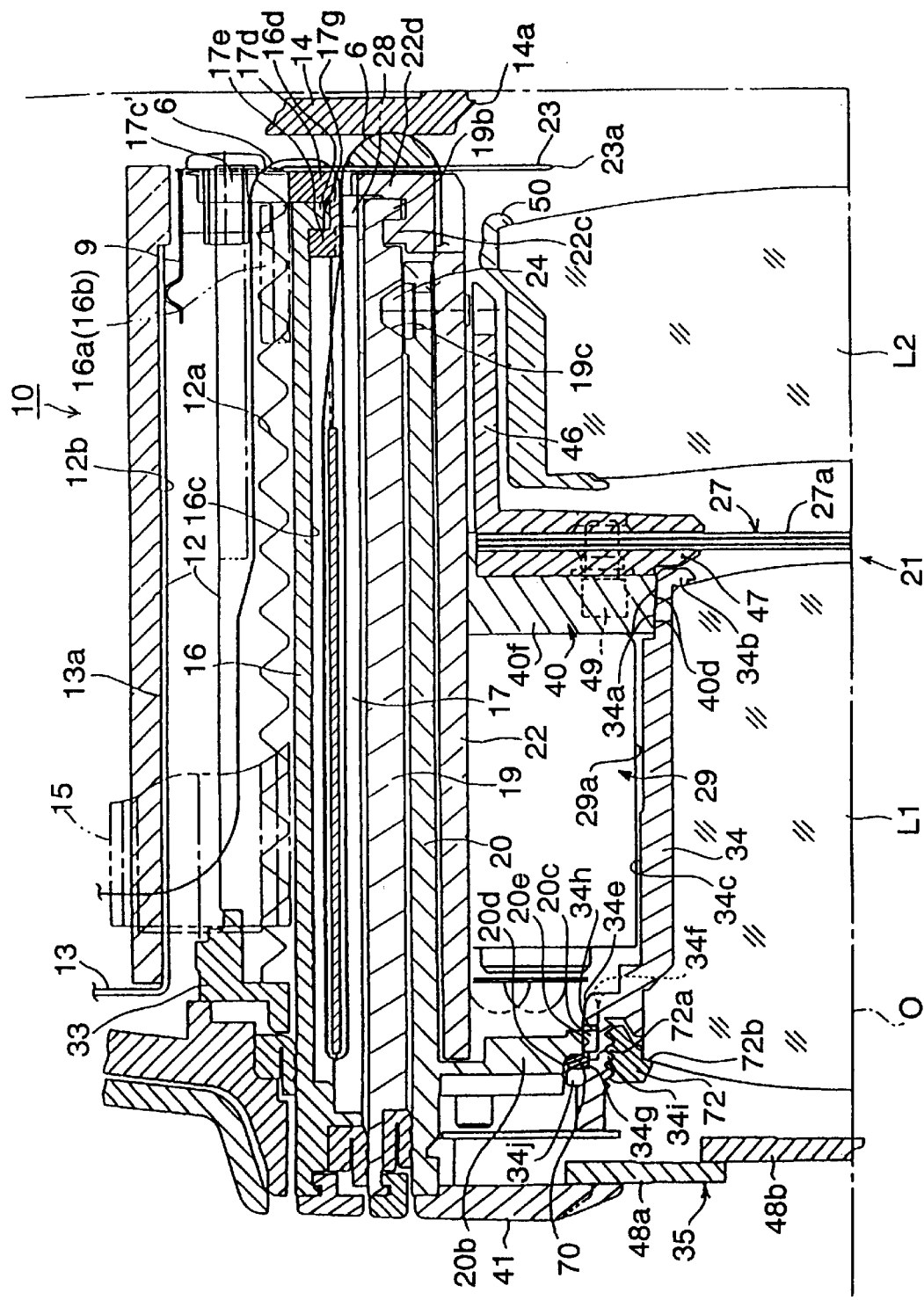
FIG. 9 is a sectional view of an upper part of the zoom lens barrel in a housed state.

As shown in FIG. 9, when the zoom lens barrel 10 is at the most retracted (withdrawn) position, i.e., the lens-housed condition. When the power switch is turned ON, the drive shaft of the whole optical unit driving motor 25 is driven to rotate in the forward rotational direction by a small amount. This rotation of the motor 25 is transmitted to the driving pinion 15 through a gear train 26, which is supported by a supporting member 32 integrally formed with the fixed lens barrel block 12, to rotate the third movable barrel 16 in one predetermined rotational direction to advance forwardly along the optical axis O. Therefore, the second movable barrel 19 and the first movable barrel 20 are each advanced by a small amount in the optical axis direction, along with the third movable barrel 16. Consequently, the camera is placed in a state capable of photographing, with the zoom lens positioned at the widest position, i.e., the wide end. In this state, the focal length may be detected in accordance with the amount of relative movement between the sliding movement of the code plate 13a and the contacting terminal 9 as the linear guide barrel 17 moves with respect to the fixed lens barrel block 12.

In the photographable state as above described, when the aforementioned zoom operating lever is manually moved towards a "tele" side, or the "tele" zoom button is manually depressed to be turned ON, the whole optical unit driving motor 25 is driven to rotate in the forward rotational direction through the whole optical unit driving motor controller 60. The rotation of the optical unit driving motor 25 causes the third movable barrel 16 to rotate in the rotational direction to advance along the optical axis O via the driving pinion 15 and the outer peripheral gear 16b. Therefore, the third movable barrel 16 is advanced from the fixed lens barrel block 12, according to the relationship between the female helicoid 12a and the male helicoid 16a. At the same time, the linear guide barrel 17 moves forwardly along the optical axis O together with the third movable barrel 16, without relatively rotating with respect to the fixed lens barrel block 12, and in accordance with the relationship between the engaging projections 17c and the linear guide grooves 12b. At this time, the simultaneous engagement of the follower pins 18 with the respective lead slots 17b and the linear guide grooves 16c causes the second movable barrel 19 to move forwardly relative to the third movable barrel 16 in the optical axis direction. In addition, the second movable barrel 10 rotates together with the third movable barrel 16 in the same rotational direction relative to the fixed lens barrel block 12. The first movable barrel 20 moves forwardly from the second movable barrel 19 along the optical axis O together with the AF/AE shutter unit 21, without relatively rotating with respect to the fixed lens barrel block 12 due to the above-noted structures in which the first movable barrel 20 is guided linearly by the linear guide member 22 and in which the follower pins 24 are guided by the lead grooves 19c. During such movements, according to the fact that the moving position of the linear guide barrel 17 with respect to the fixed lens barrel block 12 is detected through the relative slide between the code plate 13a and the contacting terminal 9, the focal length is detected.

Conversely, when the zoom operating lever is manually moved towards a "wide" side, or the "wide" zoom button is manually depressed to be turned ON, the whole optical unit driving motor 25 is driven to rotate in the reverse rotational direction by the whole optical unit driving motor controller 60, so that the third movable barrel 16 rotates in the rotational direction to retract into the fixed lens barrel block 12 together with the linear guide barrel 17. At the same time, the second movable barrel 19 is retracted into the third movable barrel 16 while rotating in the same direction as that of the third movable barrel 16, and the first movable barrel 20 is retracted into the rotating second movable barrel 19 together with the AF/AE shutter unit 21. During the above retraction driving, similar to the case of advancing driving as above described, the rear lens group driving motor 30 is not driven.

While the zoom lens barrel 10 is driven during the zooming operation, the front lens group L1 and the rear lens group L2 move as a whole, since the rear lens group driving motor 30 is not driven, which maintains a constant distance between the lens groups, as shown in FIG. 8. The focal length is input via the zoom code plate 13a and the contacting terminal 9 is indicated on an LCD panel (not shown) provided on the camera body.

At any focal length, when the release button is depressed by a half-step, the object distance measuring apparatus 64 is actuated to measure an object distance. At the same time, the photometering apparatus 65 is actuated to measure an object brightness. Thereafter, when the release button is fully depressed, the whole optical unit driving motor 25 and the rear lens group driving motor 30 are each driven by respective amounts each corresponding to the focal length information set in advance and the object distance information obtained from the object distance measuring apparatus 64, so that the front and rear lens groups L1 and L2 are respectively moved to specified positions to obtain a specified focal length and also to bring the object into focus. Immediately after the object is brought into focus, via the AE motor controller 66, the AE motor 29 is driven to rotate the circular driving member 49 by an amount corresponding to the object brightness information obtained from the photometering apparatus 65, so that the shutter 27 is driven to open the shutter blades 27a by a predetermined amount which satisfies the required exposure. Immediately after the three shutter blades 27a are opened and subsequently closed, the whole optical unit driving motor 25 and the rear lens group driving motor 30 are both driven to move the front lens group L1 and the rear lens group L2 to respective initial positions at which they were at prior to a shutter release.

In the following, the connection among the front and rear lens groups L1 and L2, the first movable barrel 20 and the AF/AE shutter unit 21, will be described in detail with reference to FIGS. 9 and 15.

In the zoom lens barrel 10, in order to accurately align the front lens group L1 with the first movable barrel 20, the front lens group L1 is supported by the front lens supporting barrel 34, the front lens supporting barrel 34 is fixed to the first movable barrel 20 in a bayonet-type mechanism at the front side, and the rear end of the front lens supporting barrel 34 is fitted to the AF/AE shutter unit 21 that is fixed to the first movable barrel 20. Thus, the front lens supporting barrel 34 is directly fixed to the first movable barrel 20 at the front side and is fixed to the first movable barrel 20 indirectly through the AF/AE shutter unit 21 at the rear side. Therefore, the front lens group L1 is accurately positioned with respect to the first movable barrel 20.

Further, to make the zoom lens water-resistant, an elastic member, such as an O-ring 70, is interposed between the front lens supporting barrel 34 and the first movable barrel 20 to prevent water from entering the first movable barrel 20.

The rear lens group L2 is supported by the rear lens supporting barrel 50 which is supported by the AF/AE shutter unit 21, such that the rear lens supporting barrel 50 is driven by the rear lens group driving motor 30 along the optical axis with respect to the AE/AF shutter unit 21. Thus, since the front lens supporting barrel 34 and the rear lens supporting barrel 50 are both supported by the first movable barrel 20 and driven as a whole, the optical axes of the front and rear lens groups L1 and L2 are maintained in coaxial alignment with greater accuracy as compared with the conventional zoom lens where the front and rear lens groups are supported by their respective, independently-driven barrels.

In particular, the arrangement of the front lens group L1, the rear lens group L2, the lens supporting barrel 34, the shutter mounting state 40, and the first movable barrel 20 is as described in the following. References herein to the front or rear of a particular part refer to what is normally considered the front or rear of a camera or camera lens.

Figure 12:
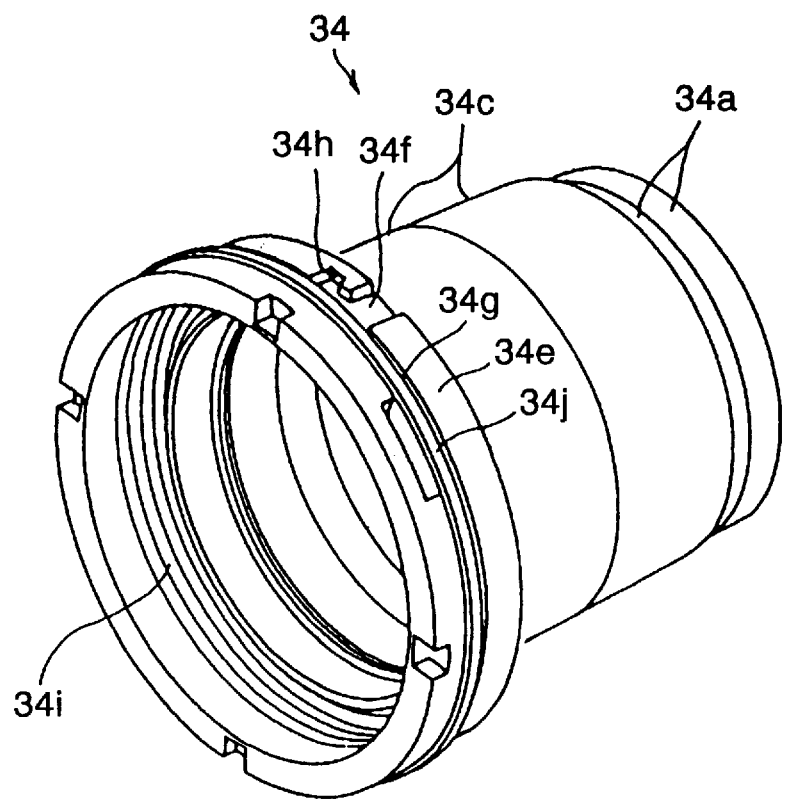
FIG. 12 is an enlarged perspective view of a lens supporting barrel in the zoom lens barrel.

With reference to FIG. 12, the front lens supporting barrel 34 includes a middle part 34c having a cylindrical shape with a predetermined diameter, a front annular fitting part 34e at the front of the middle part 34c which has a slightly larger diameter than the middle part 34c, and a rear annular fitting part 34a at the rear of the middle part 34c which has a slightly smaller diameter than the middle part 34c. The front of the front annular fitting part 34e is formed with an outward flange 34j having a larger diameter than the front annular fitting part 34e and a groove 34g which is formed on an outer surface of the front annular fitting part 34e along a parameter thereof. The O-ring 70 is provided to fit into the groove 34g.

Referring to FIG. 9, an inward flange 34b is formed at the inner rear end of the front lens supporting barrel 34. The inward flange 34b comes in contact with the rear face of the front lens group L1 when the front lens group L1 is inserted from the front of the front lens supporting barrel 34. The front lens supporting barrel 34 also includes a female screw thread 34i at the front inner peripheral portion. The front lens group L1 is fixed to the front lens supporting barrel 34 by a lens presser ring 72 that includes a male screw thread 72a that is screwed onto the female screw thread 34i of the front lens supporting barrel 34. The lens presser ring 72 also includes an annular contacting face 72b, which substantially comes into facial contact with the peripheral edge part of the front face of the front lens group L1. A waterproof coating is applied to the exterior of the annular contacting face 72b so that the joint between the front lens supporting barrel 34 and the front lens group L1 is water-resistant.

As further shown in FIG. 9, the first movable barrel 20 is provided, on the inner peripheral side, near the front thereof, with an integrally-formed inward flange 20b. The inward flange 20b has a predetermined inner diameter that defines a central hole 20e (see also FIG. 3). The diameter of the central hole 20e is slightly larger than the diameter of the front annular fitting part 34e of the front lens supporting barrel 34 such that the front annular fitting part 34e is fitted within the central hole 20e. Thus, the perimeter of the central hole 20e (i.e., the edge of the inward flange 20b restricts the movement of the front part of the front lens supporting barrel 34 in the radial direction, and sets the position, mainly in the radial direction, of the front lens group L1 with respect to the first movable barrel 20.

In order to securely connect the first lens barrel 20 and the front lens supporting barrel 34, a locking mechanism is provided. For example, three engaging claws 20c are formed at equiangular intervals on the inner peripheral edge of the inward flange 20b. During assembly, the engaging claws 20c are inserted into the groove 34g on the front lens supporting barrel 34. The engaging claws 20c enter the groove 34g via corresponding notches 34f (see FIG. 12) on the front lens supporting barrel 34. Then, by rotating the front lens supporting barrel 34 relative to the first movable barrel 20, the engaging claws 20c engage with corresponding hook parts 34h that are provided on the front annular fitting part 34e of the front lens supporting barrel 34 adjacent to the notches 34f.

Also at the front inner peripheral edge of the inward flange 20b, an annular notch 20d is formed such that when assembled, the outward flange 34j on the front lens supporting barrel 34 and the annular notch 20d sandwich and compress the O-ring 70. Thus, the O-ring 70 is positioned between the inward flange 20b of the first movable barrel 20 and the outward flange 34j of the front lens supporting barrel 34 to make the joint between the first movable barrel 20 and the front lens supporting barrel 34 water-resistant.

As described above, the annular member 40f of the shutter mounting stage 40 includes a circular opening 40d. The rear annular fitting part 34a of the front lens supporting barrel 34 has a slightly smaller diameter than the circular opening 40d. The front lens supporting barrel 34 is fitted to the circular opening 40d such that movement of the rear part of the front lens supporting barrel 34 is restricted in the radial direction by the circular opening 40d such that the position, mainly in the radial direction, of the front lens group L1 is set with regard to the shutter mounting state 40. Thus, the position of the front lens group L1 is set with respect to the rear lens group L2, which is supported by both the first movable barrel 20 and the shutter mounting stage 40.

The rear lens supporting barrel 50 is supported by the guide shafts 51 and 52 as shown in FIG. 1 and is driven by the screw shaft 43.

Figure 13:
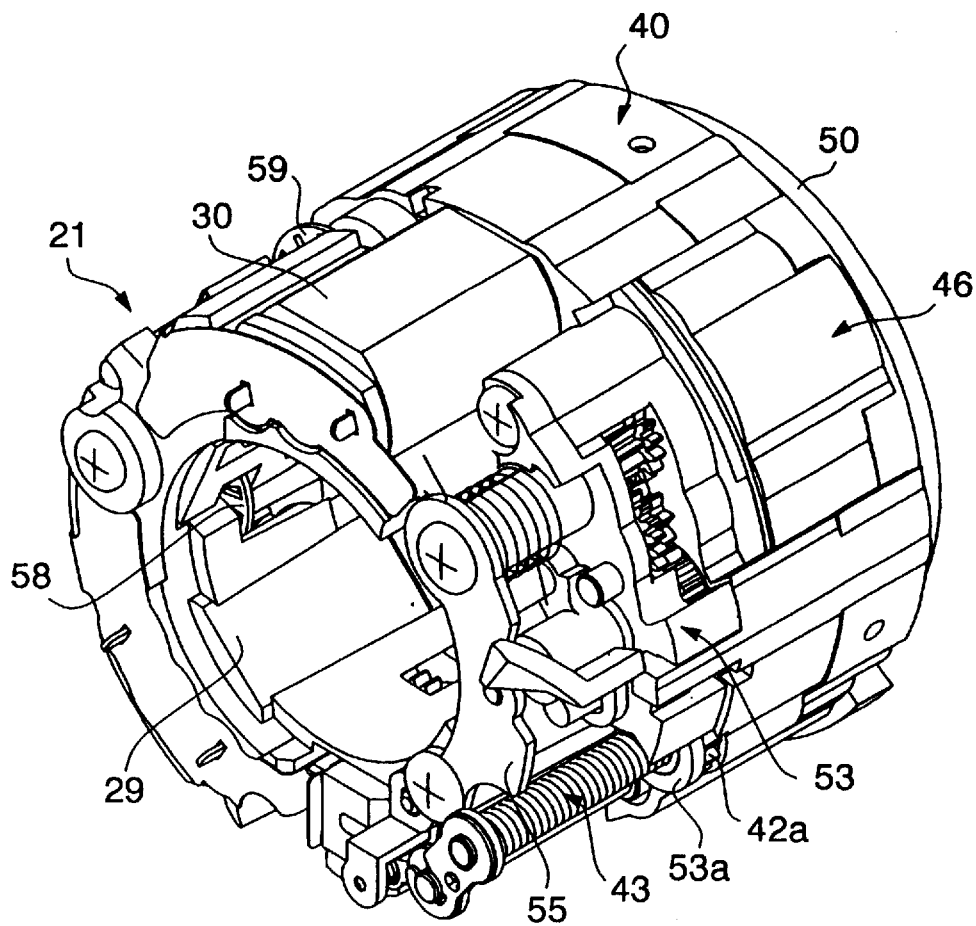
FIG. 13 is a sectional view showing an upper part of the zoom lens barrel in a housed state.

The screw shaft 43 includes a fitting portion 43a and a screw portion 43b. The fitting portion 43a fits into a fixing hole 50a formed on the rear lens supporting barrel 50 and the screw shaft 43 is tightly fixed to the rear lens supporting barrel 50. The screw portion 43b is engaged with the female thread hole of the driving gear 42a as shown in FIGS. 5 and 13. The driving gear 42a is held by a gear supporting portion 53a formed on the holding member 53 so that the driving gear 42a is rotatable about the screw portion 43b. The screw shaft 43 moves along the optical axis to drive the rear lens supporting barrel 50 as the driving gear 42a is rotated by the rear lens group driving motor 30 via the gear train 42.

Figure 14:
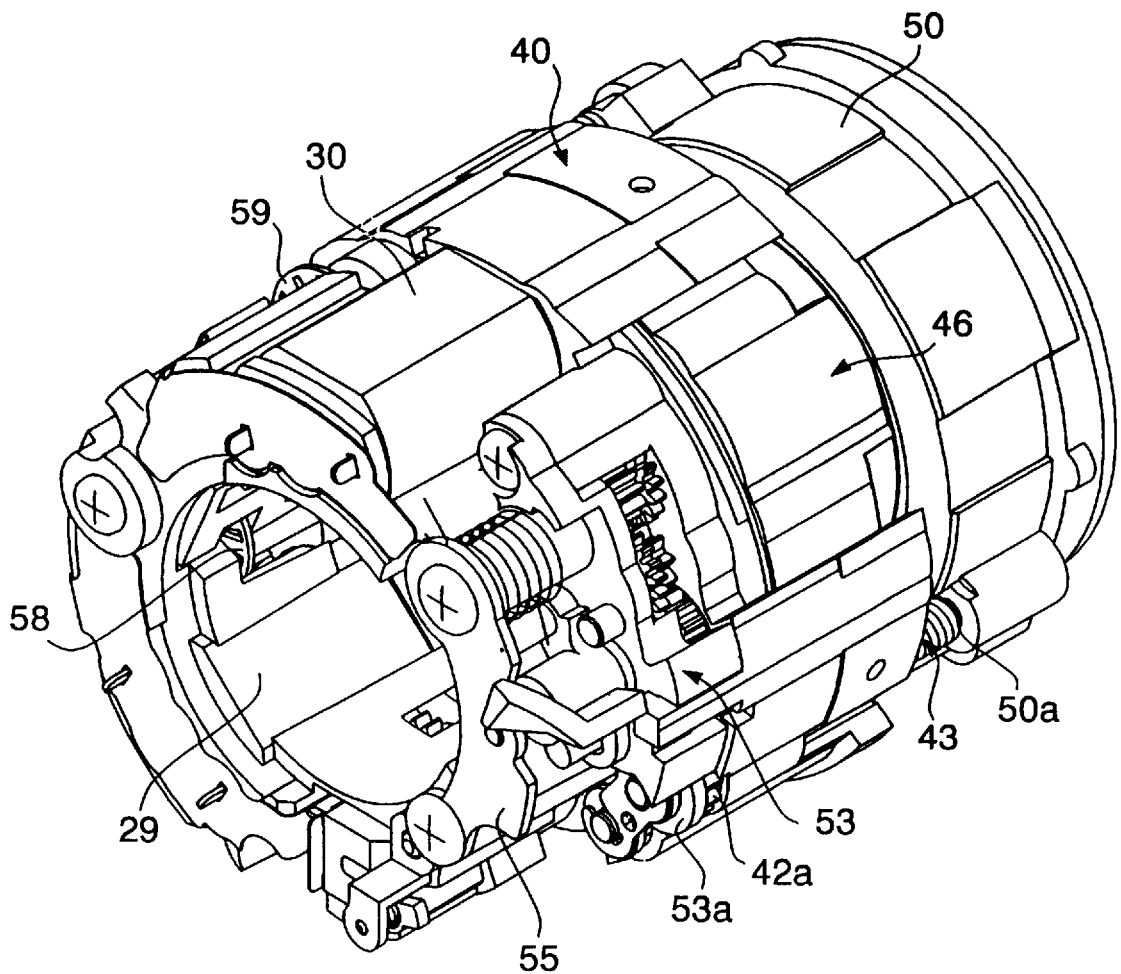
FIG. 14 is a perspective view of the AE/AF shutter unit under the condition where the rear lens group supporting barrel is in a retracted position.
Figure 15:
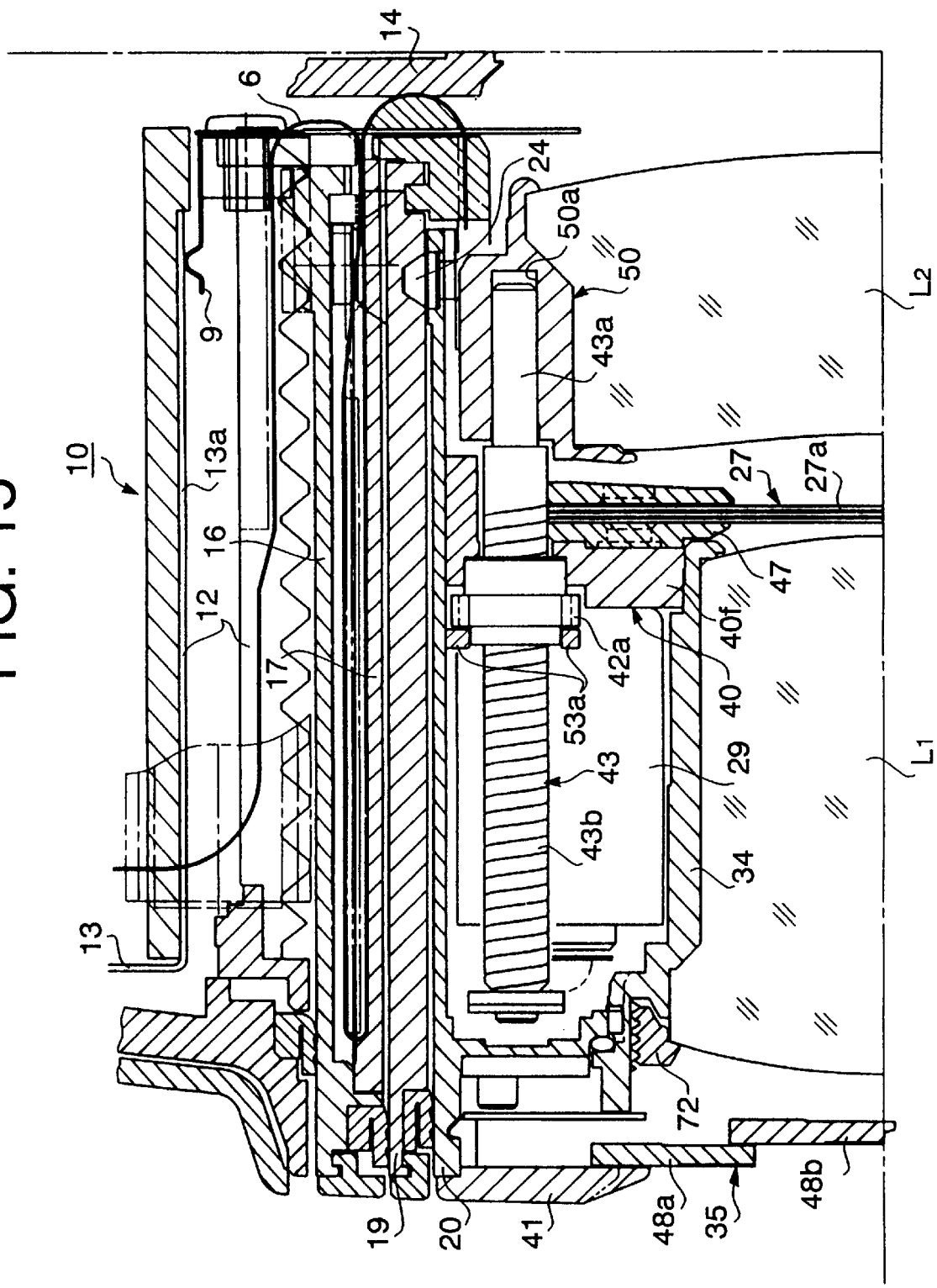
FIG. 15 is a perspective view of the AE/AF shutter unit under the condition where the rear lens group supporting barrel is in an extended position.

FIG. 14 shows the AE/AF shutter unit 21 under the condition where the rear lens group supporting barrel 50 is in a retracted position, and FIG. 15 shows the unit 21 under the condition where the rear lens group supporting barrel 50 is in an extended position.

The assembly of the front lens group L1 and the lens supporting mechanism can, for example, be performed in the following manner. First, the AF/AE shutter unit 21 is assembled, including the rear lens supporting barrel 50 holding the rear lens group L2, the shutter mounting stage 40, the circular driving member 49, the supporting member 47, the shutter 27, and the shutter blade presser ring 46. The rear lens group L2 is supported by the shutter mounting stage 40 such that it is in a predetermined positional relationship with the circular opening 40d of the shutter mounting state 40.

The AF/AE shutter unit 21 is then inserted into the rear inner side of the first movable barrel 20, and the follower pins 24 are inserted through the holes 20a and fixed to the fixing holes 40a provided on the shutter mounting stage 40. Thus, the shutter mounting stage 40 is fixed to the first movable barrel 20 such that the rear lens group L2 is in a predetermined positional relationship with respect to the movable lens barrel 20. The follower pins 24 may be fixed by, for example, adhesion, a screw thread, or the like.

Thereafter, the front lens group L1 is fitted to the inner side of the front lens supporting barrel 34, abutting against the inward flange 34b, and is fixed by screwing the lens presser ring 72 onto the female screw thread 34i. Also, the O-ring 70 is fitted into the groove 34g of the front lens supporting barrel 34.

The front lens supporting barrel 34 is then inserted into the first movable barrel 20 from the front (i.e., the rear side of the front lens supporting barrel 34 first) through the central hole 20e. The rear part of the front lens supporting barrel 34 passes through the AF/AE shutter unit 21 (i.e., at the inward side of the AE motor 29 and other parts) until the rear annular fitting part 34a fits into the circular opening 40d. At the same time that the rear annular fitting part 34a (at the rear of the front lens supporting barrel 34) enters the circular opening 40d, the engaging claws 20c enter the notches 34f on the front annular fitting part 34e (at the front of the front lens supporting barrel 34) and the O-ring 70 is sandwiched between the annular notch 20d and the outward flange 34j.

At this point, the front end (i.e., the front annular fitting part 34e) of the front lens supporting barrel 34 is pushed against the inward flange 20b (to compress the O-ring 70 slightly) and is rotated slightly in the clockwise direction (as viewed in FIG. 12). Thus, when the front lens supporting barrel 34 is released, the O-ring 70 expands back to its original shape, and the three engaging claws 20c are respectively engaged with the three hook parts 34h to firmly secure the front lens supporting barrel 34 to the first movable barrel 20.

In this manner, because the front lens supporting barrel 34 is accurately positioned in a predetermined relationship with respect to both the first movable barrel 20 and the shutter mounting stage 40, and because the rear lens group L2 is positioned accurately in a predetermined relationship with the shutter mounting state 40, the position, particularly in the radial direction, of the front lens group L1 with respect to the rear lens group L2 is set accurately and the optical axes of the front lens group L1 and the rear lens group L2 are aligned with each other. Thus, the lens supporting mechanism for a lens shutter camera of the present embodiment provides that the optical axes of the front lens group L1 and the rear lens group L2 can be aligned with each other easily and accurately.

Although the structure and operation of a lens supporting mechanism for a lens shutter camera is described herein with respect to the preferred embodiments, many modifications and changes can be made without departing from the spirit and scope of the invention. It can be applied to a lens shutter camera having a movable barrel on which a lens barrel and a shutter unit is provided, even if a photographing lens does not comprise a zoom lens.

The present disclosure relates to subject matter contained in Japanese Patent Application Nos. HEI 08-013387, filed on Jan. 29, 1996, and HEI 08-012317 filed on Jan. 26, 1996, which are expressly incorporated herein by reference in their entirety.

What is claimed is:

1. A lens supporting mechanism for a camera, said mechanism comprising:

a movable barrel that is driven along an optical axis with respect to a camera body;

a lens supporting barrel for supporting a lens group; and a shutter unit that is attached to said movable barrel, and wherein one end of said lens supporting barrel is directly fixed to said movable barrel and the other end of said lens supporting barrel is directly fixed to said shutter unit thereby indirectly fixing said other end of said lens supporting barrel to said movable barrel through said shutter unit.

2. The lens supporting mechanism according to claim 1, wherein said lens group consists of a part of a photographing lens.

3. The lens supporting mechanism according to claim 2, wherein said photographing lens comprises a zoom lens having front and rear lens groups and said front lens group is supported by said lens supporting barrel.

4. The lens supporting mechanism according to claim 3, wherein said lens supporting barrel that supports said front lens group is fixed to a front end of said movable barrel and said shutter unit is fixed to a rear end of said lens supporting barrel.

5. The lens supporting mechanism according to claim 4, wherein said front end of said lens supporting barrel is fixed to said movable barrel by a bayonet mechanism.

6. The lens supporting mechanism according to claim 4, wherein an elastic member is interposed between said lens supporting barrel and said movable barrel to make said movable barrel water-resistant.

7. The lens supporting mechanism according to claim 6, wherein said elastic member comprises an O-ring.

8. The lens supporting mechanism according to claim 3, wherein said shutter unit is located between said front lens group and said rear lens group.

9. The lens supporting mechanism according to claim 8, wherein said rear lens group is installed in another lens supporting barrel that is movably mounted on said shutter unit.

10. The lens supporting mechanism according to claim 1, wherein said movable barrel includes a first inward flange at a front end such that said front end of said lens supporting barrel is fitted into an opening inside said first inward flange; and wherein said shutter unit includes a second inward flange formed such that a rear end of said lens supporting barrel is fitted into an opening of said second inward flange.

11. A lens supporting mechanism for a lens shutter camera having a zoom lens consisting of a front lens group and a rear lens group, said mechanism comprising:

a movable barrel that is driven along an optical axis with respect to a camera body;

a shutter unit that is attached to said movable barrel;

a front lens supporting barrel which supports said front lens group, a front end of the front lens supporting barrel is fixed to the movable barrel, and said front lens group being arranged at an object side of said shutter unit, said shutter unit being fixed to a rear end of said front lens supporting barrel; and a rear lens supporting barrel for supporting said rear lens group arranged at an image side of said shutter unit, said rear lens supporting barrel being movably supported by said shutter unit.

12. The lens supporting mechanism according to claim 11, wherein said front lens supporting barrel is fixed a front end of said movable barrel.

13. The lens supporting mechanism according to claim 11, wherein said front and rear lens groups comprise a zoom lens.

14. The lens supporting mechanism according to claim 11, wherein said movable barrel includes a first inward flange at a front end such that said front end of said front lens supporting barrel is fitted into an opening inside said first inward flange; and wherein said shutter unit includes a second inward flange formed such that said rear end of said front lens supporting barrel is fitted into an opening of said second inward flange.

15. The lens supporting mechanism for a lens shutter camera having a zoom lens consisting of a front lens group and a rear lens group, said mechanism comprising:

a front lens supporting barrel for supporting said front lens group;

a movable barrel in which said front lens supporting barrel is fixed, said movable barrel adapted to be driven along an optical axis with respect to a camera body and a front end of the front lens supporting barrel is directly fixed to the movable barrel; and a shutter mounting barrel for supporting a shutter unit, said shutter mounting barrel being fixed on said movable barrel, wherein said front lens supporting barrel is provided with a front fitting portion for fitting with said movable barrel at the front end and a rear fitting portion for fitting with said shutter mounting barrel at the rear end thereof to locate the front and rear portions of the lens supporting barrel at accurate positions.

16. The lens supporting mechanism according to claim 15, further comprising a device for driving said movable barrel along said optical axis during zooming and during a release operation.

17. The lens supporting mechanism as set forth in claim 16, further comprising a device for driving said rear lens group with respect to said movable barrel during said shutter release operation.

18. The lens supporting mechanism according to claim 15, wherein said rear lens group is supported on a guide rod that protrudes rearwards from a movable block, said movable block comprising said movable barrel and a portion of said movable barrel that is driven by a shutter driving motor, and wherein said movable block is provided with a rear lens group driving motor for driving said rear lens group with respect to said movable block, and wherein said shutter driving motor drives said shutter unit.

19. The lens supporting mechanism according to claim 18, wherein said movable barrel is driven by a motor mounted on said camera body.

20. The lens supporting mechanism according to claim 15, wherein said movable barrel includes a first inward flange at the front end such that said front fitting portion of said front lens supporting barrel is fitted into an opening inside said first inward flange; and wherein said shutter mounting barrel includes a second inward flange formed such that said rear fitting portion of said lens supporting barrel is fitted into an opening of said second inward flange.

21. A lens supporting mechanism for a lens shutter camera having a zoom lens consists of a front lens group and a rear lens group, said mechanism comprising:

a front lens supporting barrel for supporting said front lens group;

a movable barrel, to which said front lens supporting barrel is fixed and which is driven along an optical axis;

a rear lens supporting barrel for supporting said rear lens group, said rear lens supporting barrel being driven with respect to said movable barrel; and a shutter mounting barrel fixed to said movable barrel, said shutter mounting barrel including a shutter unit, wherein said movable barrel includes a first inward flange integrally formed at the front end of said movable barrel such that a front side of said front lens supporting barrel is fitted into an opening inside said first inward flange; and wherein said shutter mounting barrel includes a second inward flange integrally formed with said shutter mounting barrel such that a rear side of said lens supporting barrel is fitted into an opening of said second inward flange.

22. The lens supporting mechanism according to claim 21, wherein an annular elastic member is interposed between said front lens supporting barrel and said first inward flange of said movable barrel.

23. The lens supporting mechanism according to claim 21, further comprising a locking mechanism that locks said front lens barrel in a fixed relationship to said movable barrel, wherein a front side of said lens supporting barrel is locked, by said locking mechanism, to said movable barrel, and a rear side of said lens supporting barrel is formed to fit with said shutter mounting barrel.

* * * * *